United States Patent
Shimotoyodome

(10) Patent No.: US 7,020,293 B2
(45) Date of Patent: Mar. 28, 2006

(54) NOISE REDUCTION METHOD

(75) Inventor: Tsutomu Shimotoyodome, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 551 days.

(21) Appl. No.: 10/234,117

(22) Filed: Sep. 5, 2002

(65) Prior Publication Data

US 2003/0185409 A1 Oct. 2, 2003

(30) Foreign Application Priority Data

Mar. 26, 2002 (JP) .............................. 2002/085758

(51) Int. Cl.
- H04B 15/00 (2006.01)
- H03G 3/00 (2006.01)
- G06F 17/00 (2006.01)
- H03F 1/14 (2006.01)
- H03F 1/26 (2006.01)

(52) U.S. Cl. ..................... 381/94.5; 381/107; 381/104; 381/94.1; 330/51; 330/149; 700/94

(58) Field of Classification Search ............... 381/94.1, 381/94.5, 56–57, 120, 104, 107; 700/94; 330/149, 51, 251, 207 A
See application file for complete search history.

(56) References Cited

U.S. PATENT DOCUMENTS

| | | | | |
|---|---|---|---|---|
| 5,796,851 A | * | 8/1998 | Hewitt et al. ............... | 381/94.5 |
| 5,915,030 A | * | 6/1999 | Viebach ...................... | 381/94.5 |
| 6,040,740 A | * | 3/2000 | Dondale ...................... | 330/149 |
| 6,072,367 A | * | 6/2000 | Mase .......................... | 330/278 |
| 6,316,993 B1 | | 11/2001 | Hellums | |
| 6,678,382 B1 | * | 1/2004 | Peterson ..................... | 381/104 |
| 6,697,612 B1 | * | 2/2004 | Nicollini et al. ............ | 455/310 |
| 2001/0026624 A1 | * | 10/2001 | Kon et al. ................... | 381/104 |

FOREIGN PATENT DOCUMENTS

| | | |
|---|---|---|
| JP | 01-099307 | 4/1989 |
| JP | 10/032433 | 2/1998 |

* cited by examiner

*Primary Examiner*—Laura A. Grier
(74) *Attorney, Agent, or Firm*—Wenderoth, Lind & Ponack, L.L.P.

(57) ABSTRACT

A method of reducing a noise generated from a speaker at the time of power on/off in an audio output device that drives the speaker. The device includes a digital DC attenuator, a D/A converter, and an operational amplifier. The attenuator gradually changes an output digital value from a first digital value to a second digital value. The converter converts an output from the attenuator into an analog signal. The amplifier amplifies an output from the converter and drives a speaker. At the time of power on, the output from the attenuator is gradually changed from a digital value corresponding to the ground level to a digital value corresponding to the signal ground value. At the time of power off or system reset, the output from the attenuator is gradually changed from the digital value corresponding to the signal ground value to the digital value corresponding to the ground level.

16 Claims, 4 Drawing Sheets

NOISE REDUCTION METHOD

BACKGROUND OF THE INVENTION

1. Field of the Invention

The present invention relates to a method of reducing a noise generated from a speaker at the time of power on/off and reset of an electronic equipment.

2. Description of the Related Art

Conventionally, in the case of driving a speaker in an electronic equipment such as an audio output device, a digital signal is inputted into a D/A converter, an analog output from the D/A converter is inputted to an Op-amp, an output from the Op-amp is outputted to an output terminal, and then, a sound or the like is outputted from a speaker via an external capacitor.

However, in such a case where a signal of ½VDD (signal ground) is inputted as an input signal of a D/A converter, an output of the D/A converter sharply rises up to ½VDD level at the time of power on, and an output of an Op-amp also shows a sharp change from a ground (GND) level or a high impedance state to a signal ground level. Therefore, the sharp change in potential is inputted to a speaker via a capacitor, which causes the noise. Also, in such a case where the output of the Op-amp shows a sharp change from the signal ground potential to the GND potential or a high impedance state at the time of power off or the reset, the sharp change in the potential is inputted to the speaker via a capacitor and causes the noise therein.

SUMMARY OF THE INVENTION

The present invention provides a method for reducing noise generation from a speaker at the time of power on/off and reset with a simple configuration. The method of the present invention is mainly applied to an audio output device that drives a speaker.

For its achievement, the audio output device using the noise reduction method according to the present invention is provided with a digital DC attenuator, a D/A converter, and an operational amplifier. The digital DC attenuator functions to gradually change an output digital value from a first digital value to a second digital value. The D/A converter functions to convert an output from the digital DC attenuator into an analog signal. The operational amplifier functions to amplify an output from the D/A converter and then drives a speaker. At the time of power on, the output from the digital DC attenuator is gradually changed from a digital value corresponding to the ground level to a digital value corresponding to the signal ground value. On the other hand, at the time of power off or system reset, the output from the digital DC attenuator is gradually changed from the digital value corresponding to the signal ground value to the digital value corresponding to the ground level.

DETAILED DESCRIPTION OF THE PREFFERRED EMBODIMENTS

Figure 1:
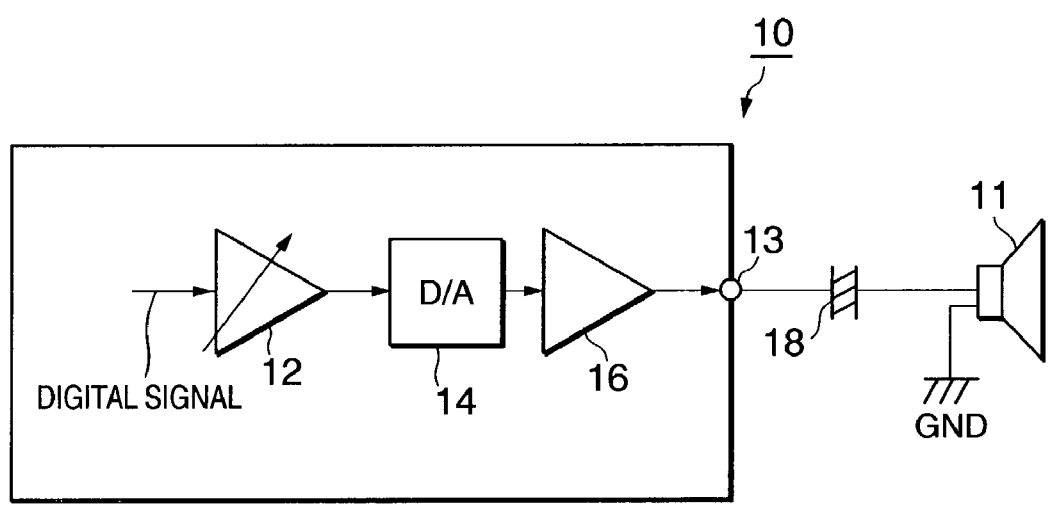
FIG. 1 is a partial block diagram showing the first embodiment of the audio output device to which the present invention is applied.

Hereinafter, embodiments of the present invention will be described with reference to the accompanying drawings. Note that the size, shape, and positional relationship of the components shown in the drawings are schematically shown for a better understanding of the present invention. Also, the numerical conditions described below are nothing but examples.

First Embodiment

FIG. 1 is a partial block diagram showing the first

FIG. 1 is a partial block diagram showing the first embodiment of the audio output device 10 to which the present invention is applied. In FIG. 1, the audio output device 10 is provided with a digital soft operational circuit or a hardware operational circuit for controlling a signal ground level in a DC manner, and the hardware 12 controlling a digital signal in a DC manner is referred to as a digital DC attenuator. Other components shown in FIG. 1 are a D/A converter 14 functioning to input an output from the digital DC attenuator 12 and to output an analog signal, an operational amplifier 16 functioning to input the analog signal outputted from the D/A converter 14, and an output terminal 13 of the output signal from the operational amplifier 16.

Normally, the digital DC attenuator 12 directly outputs an inputted digital signal to the D/A converter. However, the digital DC attenuator 12 performs, only at the time of the power on/off and the reset, the variable control of the DC value of the digital signal by the soft operation of the digital data or by the addition or subtraction of the data by the hardware regardless of the input data.

Figure 2:
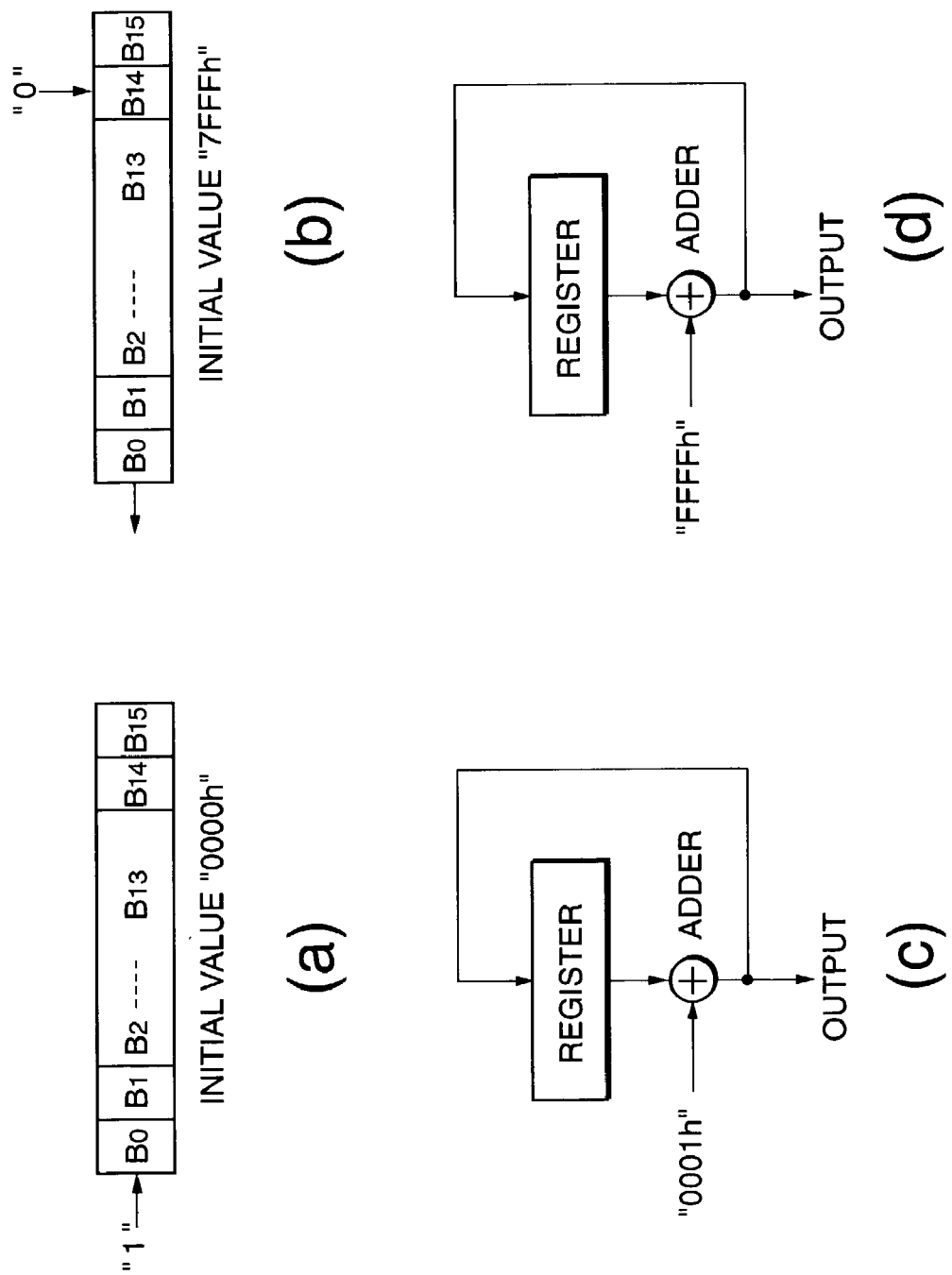
FIG. 2A is a drawing showing an example of a configuration of a digital DC attenuator.
FIG. 2B is a drawing showing an example of a configuration of a digital DC attenuator.
FIG. 2C is a drawing showing an example of a configuration of a digital DC attenuator.
FIG. 2D is a drawing showing an example of a configuration of a digital DC attenuator.

FIGS. 2A and 2B are drawings showing examples of the configuration of the digital DC attenuator. FIG. 2A exemplifies a case where "1" is inputted from the side of bit 0 by use of a shift register and then a soft operation is conducted for bit shift, thereby gradually changing an output data from the initial value "0000h" (corresponding to GND) to exemplifies a case where "0" is inputted from the side of bit 14 by use of an internal shift register and then an operation for 1 bit shift is repeated, thereby gradually changing the output data from "7FFFh" to "0000h"

Also, FIG. 2C exemplifies the case where the output of the digital DC attenuator 12 is gradually changed by the hardware operation from "0000h" to "7FFFh" by use of a 16 bit shift register and an adder. FIG. 2D exemplifies the case where the output of the digital DC attenuator 12 is gradually changed by the hardware operation from "7FFFh" to "0000h" by use of a 16 bit shift register and an adder.

First, at the time of power on, the output of the digital DC attenuator 12 is gradually changed from "0000h" (GND level) to the ground level of the analog signal "7FFFh", and is then inputted to the D/A converter 14. By doing this, the output of the D/A converter 14 is gradually changed from 0V to ½Vdd level, which corresponds to the signal ground of the analog signal, and the signal drives the speaker 11 via the output terminal 13 and the capacitor 18. Therefore, the noise generation from the speaker 11 can be reduced.

Also, at the time of power off or the system reset, the output level of the digital DC attenuator is gradually changed from the signal ground level (½VDD) to the GND level based on the corresponding control signal regardless of the input signal. Accordingly, the signal for driving the speaker 11 is gradually changed from ½VDD to 0V. Thus, the noise generation from the speaker 11 can be reduced.

Second Embodiment

Figure 3:
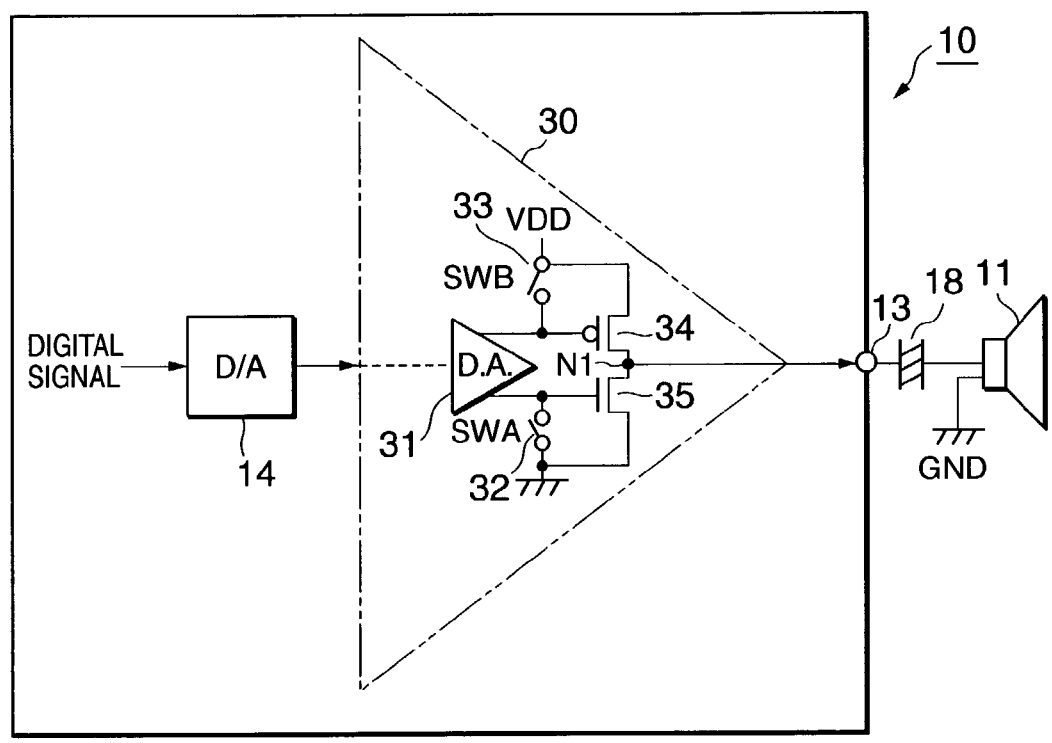
FIG. 3 is a partial block diagram showing the second embodiment of the audio output device to which the present invention is applied.

FIG. 3 is a partial block diagram showing the second embodiment of the audio output device 10 to which the present invention is applied. In FIG. 3, the components denoted by the same reference numerals as those in FIG. 1 indicate the same components as those in the first embodiment. An operational amplifier 30 in FIG. 3 is composed of a differential amplifier 31, output stages of which have differential outputs, a switch SWA 32 and an NMOS transistor (NMOS) 35 connected to one of the outputs of the differential output, a switch SWB 33 and a PMOS transistor (PMOS) 34 connected to the other of the outputs of the differential output.

One terminal of the switch SWA 32 is connected to one of the outputs of the differential amplifier 31, and the other terminal of the switch SWA 32 is connected to GND. Also, the source of the NMOS 35 is connected to GND, the drain of the NMOS 35 is connected to an output node N1, and the gate of the NMOS 35 is connected to the one output of the differential amplifier 31.

Also, one terminal of the switch SWB 33 is connected to the other of the outputs of the differential amplifier 31, and the other terminal of the switch SWB 33 is connected to a power supply VDD. Also, the source of the PMOS 34 is connected to VDD, the drain of the PMOS 34 is connected to the output node N1, and the gate of the PMOS 34 is connected to the other output of the differential amplifier 31.

In a normal operation, the operational amplifier 30 in this device 10 outputs an analog signal from the node N1 based on the differential output signal from the differential amplifier 31 in the front output stage composed of the NMOS 35 and the PMOS 34, with both the switches SWA 32 and SWB 33 being in the switch-off (non-conduction) state. When both the SWA 32 and the SWB 33 are switched on (conduction), both the NMOS 35 and the PMOS 34 are in an off state, and the output is in the high impedance state.

At the time of power on, the D/A converter is activated while the SWB 33 is in an on state and the SWA 32 is in an off state based on a control signal (not shown). By doing this, the output of the operational amplifier 30 becomes the GND level regardless of the output level of the D/A converter 14. Therefore, the noise generation from the speaker 11 can be reduced.

When the output of the D/A converter is stabilized, the SWB 33 is switched off, and then, the signal outputting from the operational amplifier 30 is started.

At the time of power off or system reset, the output of the operational amplifier 30 is changed to the GND level by switching on the SWB 33 of the operational amplifier 30. Then, the SWA 32 is switched on and the D/A converter 14 is turned off, by which the sharp change in the output stage of the operational amplifier 30 at the time of power off or the system reset is eased and the noise generation is reduced.

Third Embodiment

Figure 4:
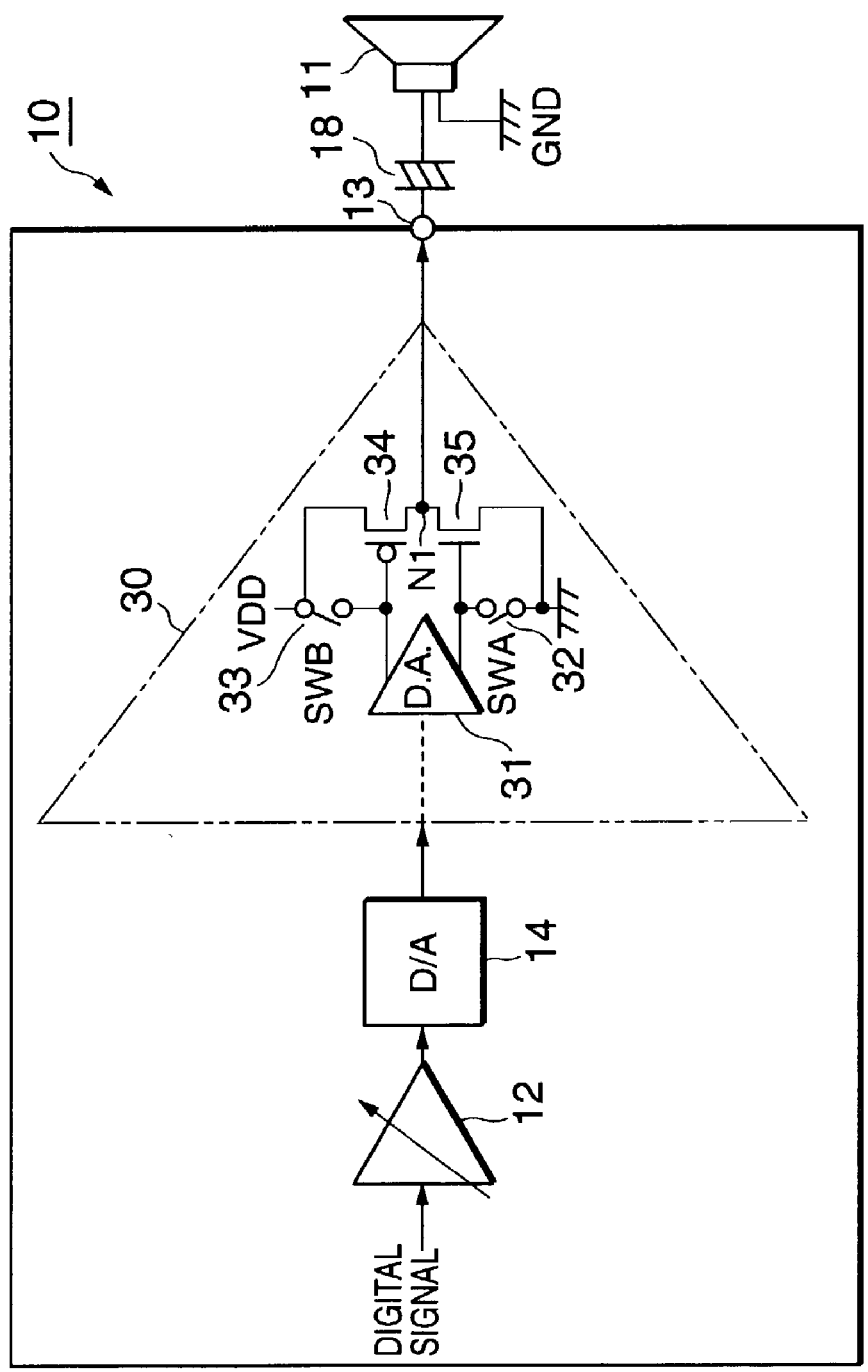
FIG. 4 is a partial block diagram showing the third embodiment of the audio output device to which the present invention is applied.

FIG. 4 is a partial block diagram showing the third embodiment of the audio output device 10 to which the present invention is applied. As shown in FIG. 4, the third embodiment is different from the second embodiment in that the digital DC attenuator 12 is connected to the front stage of the D/A converter 14. Otherwise, the configuration of the third embodiment is identical to that of the second embodiment.

At the time of power on, the input of the D/A converter 14 is gradually risen up from the GND level to the signal ground level by the digital DC attenuator 12, and simultaneously, the SWA 32 and the SWB 33 are sequentially switched off in this order based on the control signal (not shown). As a result, the output level of the node N1 is gradually risen up from the GND level.

Also, at the time of power off or system reset, the input of the D/A converter 14 is gradually decreased from the signal ground level to the GND level by the digital DC attenuator 12, and simultaneously, the switches SWA 33 and SWB 32 of the operational amplifier 31 are sequentially switched on in this order. As a result, the output N1 of the operational amplifier 30 is gradually decreased to the GND level.

By so doing, the noise generated from the speaker at the time of power on/off can be reduced.

What is claimed is:

1. An audio output device comprising:
   a digital attenuator operable to receive an audio input signal and to generate an audio output signal, said digital attenuator having a capability of gradually changing an output digital value of the audio output signal from a first digital value to a second digital value regardless of the audio input signal;
   a D/A converter coupled to said digital attenuator, said D/A converter being operable to convert the audio output signal to an analog signal; and
   an operational amplifier coupled to said D/A converter, said operational amplifier being operable to amplify the analog signal;
   wherein, said digital attenuator is operable to
      gradually change the output digital value from a digital value corresponding to a ground level to a digital value corresponding to a signal ground value during a power on,
      gradually change the output digital value from a value corresponding to the signal ground value to the digital value corresponding to the ground level during a power down or a system reset, and
      pass the audio output signal therethrough during a time other than the power on, power down and system reset.

2. The audio output device according to claim 1, wherein said digital attenuator includes a 16 bit register, and when gradually increasing the output digital value, a bit shift operation is conducted after inputting "1" from the lower bit side so as to change the output digital value, and when gradually decreasing the output digital value, a bit shift operation is conducted after inputting "0" from the upper bit side, so as to reduce the output digital value.

3. The audio output device according to claim 1,
   wherein said digital attenuator device includes a register and an adder,
   wherein an output of said adder is an input of said register, an output of said register is one of the inputs of said adder, and the output of said adder is gradually increased or decreased by inputting "1" or "−1" from the other input of said adder.

4. The audio output device according to claim 1, wherein said operational amplifier is coupled to a speaker.

5. The audio output device according to claim 4, wherein said operational amplifier is coupled to the speaker through a condenser.

6. An audio output device comprising:
a D/A converter operable to convert a digital signal into an analog signal; and
an operational amplifier operable to amplify an output of said D/A converter; wherein:
said operational amplifier is provided with a differential amplifier on the output side of said operational amplifier, wherein one of the outputs of differential outputs is connected to a first switch and also to a gate electrode of an NMOS transistor, and the other of the outputs of the differential outputs is connected to a second switch and also to a gate electrode of a PMOS transistors;
a source electrode of the NMOS transistor is connected to a ground potential and a drain electrode of the NMOS transistor is connected to an output node;
a source electrode of the PMOS transistor is connected to a power supply potential and a drain electrode of the PMOS transistor is connected to the output node;
during a power on, the second switch is controlled to make the PMOS transistor be in an non-operational state, and then, said D/A converter is activated; and
during a power off or system reset, the second switch is controlled to make the NMOS transistor be in the non-operational state, the first switch is then controlled to make the PMOS transistor be in the non-operational state, and thereafter, said D/A converter is turned off.

7. The audio output device according to claim 6, wherein said operational amplifier is coupled to a speaker.

8. The audio output device according to claim 7, wherein said operational amplifier is coupled to the speaker through a condenser.

9. The audio output device according to claim 6, wherein the first and second switches are in the non-operational state during a time other than the power on, power off and system reset.

10. An audio output device comprising:
a digital attenuator operable to receive an audio input signal and to generate an audio output signal said digital attenuator having a capability of gradually changing an output digital value from a first digital value to a second digital value regardless of the audio input signal;
a D/A converter operable to convert the audio output signal into an analog signal; and
an operational amplifier operable to amplify an output of said D/A converter; wherein:
said operational amplifier is provided with a differential amplifier on the output side of said operation amplifier, wherein one of the outputs of differential outputs is connected to a first switch and also to a gate electrode of an NMOS transistor, and the other of the outputs of the differential outputs is connected to a second switch and also to a gate electrode of a PMOS transistors;
a source electrode of the NMOS transistor is connected to a ground potential and a drain electrode of the NMOS transistor is connected to an output node;
a source electrode of the PMOS transistor is connected to a power supply potential and a drain electrode of the PMOS transistor is connected to the output node;
during a power on, said digital attenuator is operable to gradually change an input of said D/A converter from a digital value corresponding to a ground potential to a digital value corresponding to a signal ground level, and simultaneously, the first and second switches are controlled to sequentially change the NMOS transistor and the PMOS transistor from the non-operational state to the operational state in this order; and
during a power off or system reset, said digital attenuator is operable to gradually change an input of said D/A converter from the digital value corresponding to the signal ground level to the digital value corresponding to the ground potential, and simultaneously, the second and first switches are controlled to sequentially change the PMOS transistor and the NMOS transistor to the non-operational state in this order.

11. The audio output device according to claim 10, wherein said digital attenuator includes a 16 bit register, and when gradually increasing the output digital value, a bit shift operation is conducted after inputting "1" from the lower bit side so as to change the output digital value, and when gradually decreasing the output digital value, a bit shift operation is conducted after inputting "0" from the upper bit side so as to decrease the output digital value.

12. The audio output device according to claim 10, wherein said digital attenuator includes a register and an adder,
wherein an output of said adder is an input of said register, an output of said register is one of the inputs of said adder, and the output of said adder is gradually increased or decreased by inputting "1" or "−1" from the other input of said adder.

13. The audio output device according to claim 10, wherein said operational amplifier is coupled to a speaker.

14. The audio output device according to claim 13, wherein said operational amplifier is coupled to the speaker through a condenser.

15. The audio output device according to claim 10, wherein the first and second switches are in the non-operational state during a time other than the power on, power down and system reset.

16. The audio output device according to claim 10, wherein the digital attenuator passes the audio output signal therethrough during the time other than the power on, power down and system reset.

* * * * *